US006137273A

United States Patent [19]

Bales et al.

[11] Patent Number: 6,137,273

[45] Date of Patent: Oct. 24, 2000

[54] CIRCUIT FOR SUPPLYING A HIGH PRECISION CURRENT TO AN EXTERNAL ELEMENT

[75] Inventors: Tim Bales, Warfield, United Kingdom; Serge Bitz, Thielle-Wavre, Switzerland

[73] Assignee: EM Microelectronic-Marin SA, Marin, Switzerland

[21] Appl. No.: 09/173,162

[22] Filed: Oct. 15, 1998

[30] Foreign Application Priority Data

Oct. 15, 1997 [EP] European Pat. Off. .............. 97117804

[51] Int. Cl.[7] ................................ G05F 1/40; G05F 3/04; G05F 3/16; H03F 3/26

[52] U.S. Cl. .......................... 323/269; 323/312; 323/316; 330/269; 330/271

[58] Field of Search .................................... 323/369, 312, 323/316; 330/269, 271

[56] References Cited

U.S. PATENT DOCUMENTS

| | | | |
|---|---|---|---|
| 3,962,592 | 6/1976 | Thommen et al. | 307/297 |
| 4,150,309 | 4/1979 | Tokuda | 307/310 |
| 4,292,584 | 9/1981 | Kusakabe | 323/316 |
| 4,349,777 | 9/1982 | Mitamura | 323/226 |
| 4,399,399 | 8/1983 | Joseph | 323/315 |
| 4,700,144 | 10/1987 | Thomson | 323/316 |
| 4,706,013 | 11/1987 | Kuo | 323/316 |
| 4,808,907 | 2/1989 | Main | 323/316 |
| 5,107,199 | 4/1992 | Vo et al. | 323/316 |
| 5,124,632 | 6/1992 | Greaves | 323/316 |
| 5,291,123 | 3/1994 | Brown | 323/269 |

*Primary Examiner*—Peter S. Wong
*Assistant Examiner*—Bao Q. Vu
*Attorney, Agent, or Firm*—Sughrue, Mion, Zinn, Macpeak & Seas, PLLC

[57] ABSTRACT

The present invention concerns a circuit (30; 50) for supplying a first current (I3) to an external element (3), this current having to be supplied with high precision at a desired nominal value. The current supply circuit includes a first transistor (T3) through which the first current flows, an operational amplifier (A2) to a first input of which a reference voltage (Vref) is supplied, and to an output of which a control signal from the first transistor is supplied, and an external resistor (Re1; Re2). These the circuit is characterized in that it further includes a second transistor (T4) through which a second current (I4; I4/m) flows, said second current also flowing through the external resistor. Such an arrangement of the circuit according to the present invention allow the value of the first current to be trimmed with great precision to its nominal value.

8 Claims, 3 Drawing Sheets

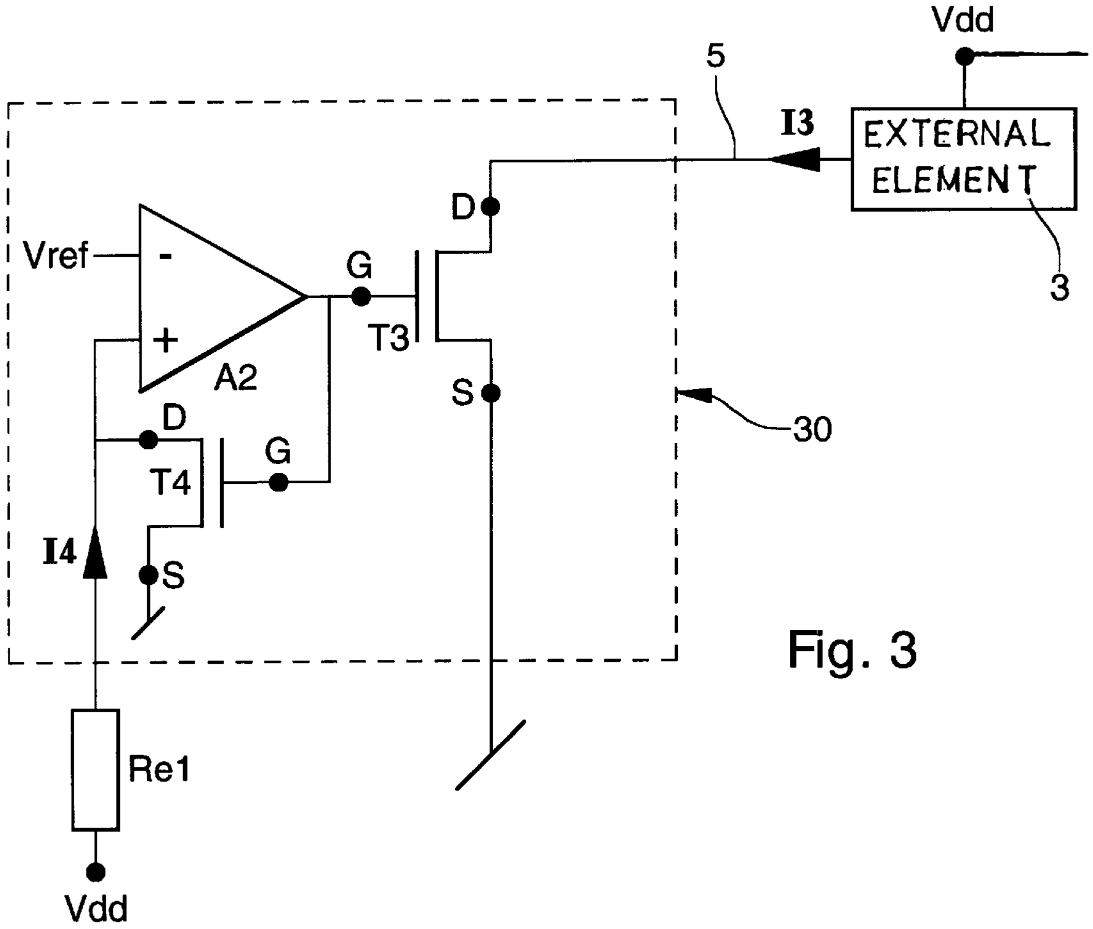
Fig. 3
Fig. 4
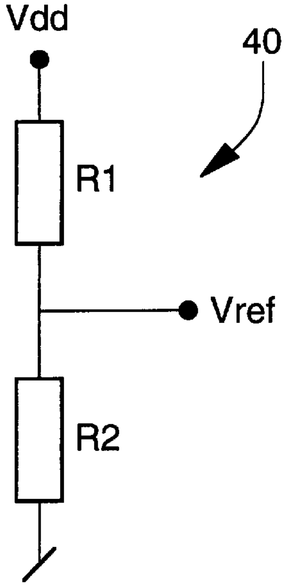

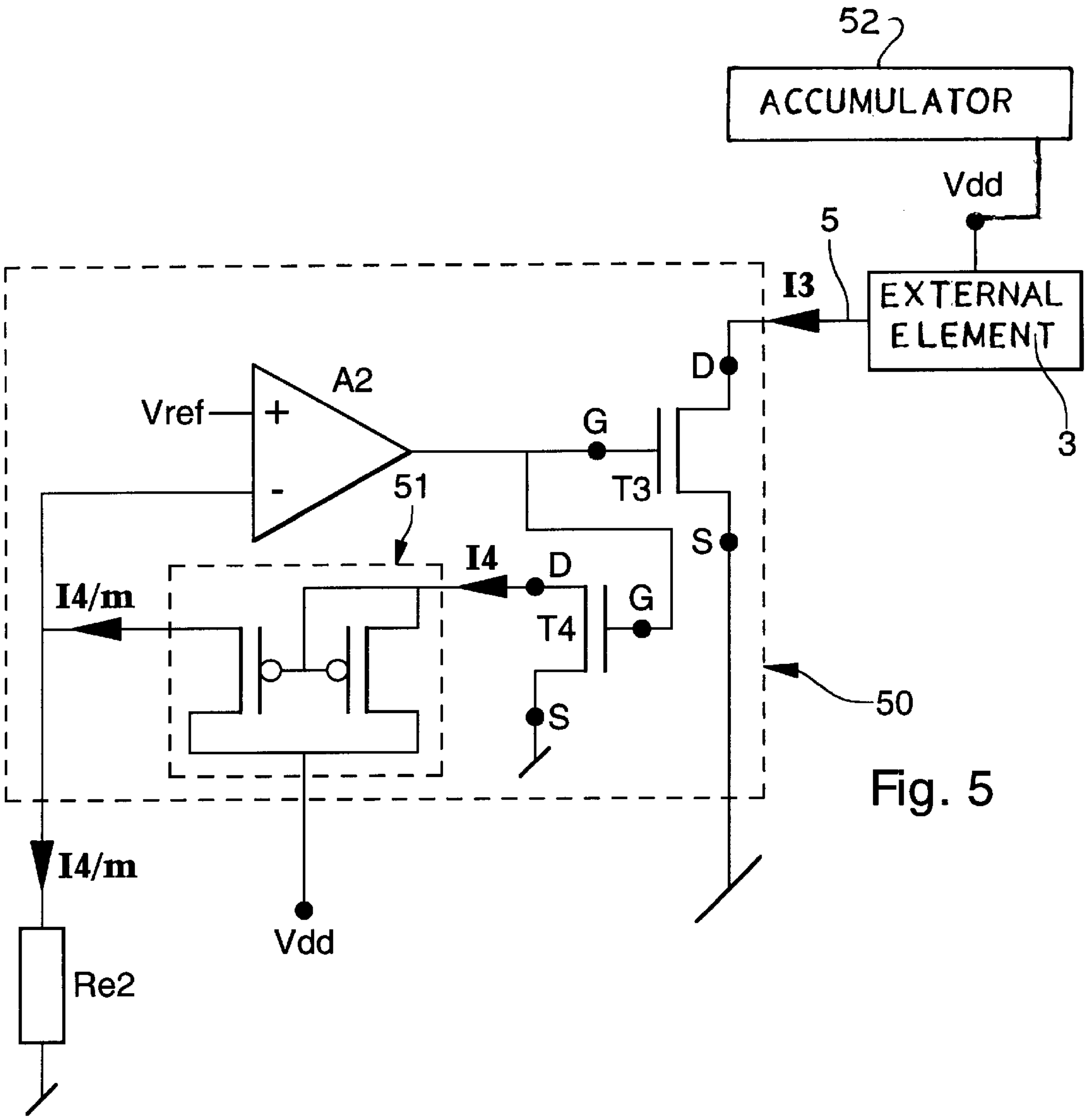
Fig. 5
Fig. 6
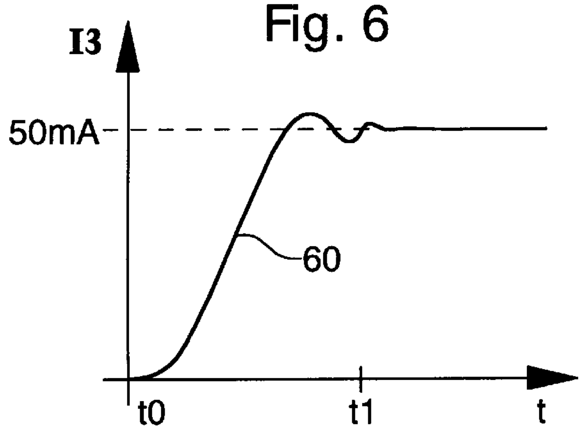

CIRCUIT FOR SUPPLYING A HIGH PRECISION CURRENT TO AN EXTERNAL ELEMENT

BACKGROUND OF THE INVENTION

The present invention concerns means for supplying a current. More precisely, it concerns means for supplying a high prevision current, to an external element intended to be connected to such means.

Conventionally, there exist various types of current supply means. Moreover, it will be noted that the present description does not concern what are commonly called current sources.

FIG. 1 shows a circuit including a first example of conventional current supply means 1 intended to be connected, via a connecting line 5 to an element 3 which is external to such circuit. Means 1 are arranged to supply element 3 with a current I1 having a predetermined desired value or nominal value, this value being designated by the reference I1*o*. For this purpose, means 1 include an operational amplifier A1, and a field effect transistor T1. Means 1 further include integrated resistors such as field effect transistors having an ohmic response, the reference Rint designating the resistor equivalent to the totality of these integrated resistors. Typically, the different components of means 1 are made by a CMOS type manufacturing process widely used in the semi-conductor industry. It goes without saying that these components also include a terminal for connection to a voltage source (not shown) arranged for supplying a supply voltage Vdd to these components.

Transistor T1 made via a process of the aforementioned type, typically includes a drain terminal D, a source terminal S and a gate terminal G. Terminal D of transistor T1 is connected to external element 3 by line 5, and terminal S of transistor T1 is connected to one of the terminals of resistor Rint. Furthermore, operational amplifier A1 typically includes an inverting input terminal, a non-inverting input terminal and an output terminal. The inverting input terminal of operational amplifier A1 is connected to voltage supply means (not shown) arranged for supplying a reference voltage Vref, its non-inverting input terminal is connected to terminal S of transistor T1, and the output terminal of operational amplifier A1 is connected to terminal G of transistor T1.

Essentially, following powering the circuit shown in FIG. 1, the latter becomes stable when the voltage at the non-inverting input terminal of operational amplifier A1 (i.e. the voltage at source terminal S) is substantially equal to that at the inverting input terminal of operational amplifier A1 (i.e. reference voltage Vref). In this case, the output voltage of operational amplifier A1 is substantially constant, so that said voltage provided to terminal G of transistor T1 maintains current I1, which flows through this transistor T1, equal to its nominal value.

The circuit shown in FIG. 1 allows the value of current I1 to be trimmed to its nominal value. The practical realisation of the various components of this circuit inevitably leads to variations in technological parameters, in particular the value of internal resistor Rint which varies by up to +30% with respect to the desired value thereof. Such variations cause current I1 to be provided at a different value from its nominal value.

In order to overcome these ill-timed variations, one then measures the value of current 1 provided to means 1 to which the integrated resistors are connected which are initially short-circuited by connecting lines, as is shown in FIG. 1. Next, certain of these connecting lines are cut by a laser beam, which connects the integrated circuits initially short-circuited by said lines to means 1. This has the effect of increasing the value of resistor Rint connected in series with transistor T1, i.e. of modifying the value of current I1. Such trimming is performed until the value cf current I1 is equal to its nominal value.

One drawback of the current supply means shown in FIG. 1, lies in the fact that it requires the making of a plurality of trimming elements, which is contrary to the usual concerns of the semi-conductor industry as to complexity, space requirement and cost.

Another drawback of the current supply means shown in FIG. 1 lies in the fact that the trimming can be irreversibly performed, so that these means are only suitable for the external element to which means 1 were connected during said trimming.

In order to overcome this drawback, FIG. 2 show a circuit including a second example of conventional current supply means 6. It will be noted that this circuit is similar to that shown in FIG. 1. Thus, the components shown in FIG. 2 and designated by the same references as those shown in FIG. 1, are identical to those shown in FIG. 1.

However, means 6 are connected to a resistor Rext external to said means. Resistor Rext is connected between terminal S of transistor T1 and earth. U.S. Pat. No. 5,291,123 discloses an electric diagram of the same type as that of the circuit described in relation to FIG. 2.

Like resistor Rint described in relation to FIG. 1, resistor Rext shown in FIG. 2 allows current I1 to be trimmed tc its nominal value. For this purpose, the value of current I1 is first determined prior to being provided by means 1 of the circuit shown in FIG. 1. Assuming that voltage Vref is determined as a function of the choice of operation amplifier A1, and that the circuit is stable when the voltage at the non-inverting input terminal of said amplifier (i.e. the voltage equal to the product of the resistance value of resistor Rext by current I1) is equal to the voltage at its inverting input terminal (i.e. voltage Vref), the value of resistor Rext can be determined as follows:

$$Rext = \frac{Vref}{I1o}$$

The value of external resistor Rext intended to be connected to means 6 is thus determined, this connection having to have the effect of trimming the value of current I1 to its nominal value.

One drawback of the current supply means shown in FIG. 2 lies in the fact that it requires the making of a resistor Rext having a low resistance value, in the event that the value of current I1 to be provided must be high. Assuming that supply voltage Vdd is known and constant, the voltage across terminal D of transistor T1 and earth is thus determined and substantially constant. Consequently, a high value of resistor Rext has the effect of reducing the voltage across terminal D of transistor T1 and terminal S thereof, since resistor Rext is connected in series with external element 3 and transistor T1. It is thus necessary to increase the active surface dimensions of transistor T1 so that current I1 which flows through it is equal to said predetermined value.

Those skilled in the art will note that the implementation of a resistor Rext having a low resistance value (typically of the order of several ohms) is costly, in particular in the event that one wishes this resistor to have ar accuracy of the order of +5%.

It will be noted therefore that such a solution does not answer the conventional criteria in the semi-conductor industry as to complexity, space requirement and cost.

SUMMARY OF THE INVENTION

An object of the present invention is to provide means for supplying a high precision current, these means overcoming the aforementioned drawbacks.

Another object of the present invention is to provide such current supply means, without the necessity of integrating additional trimming elements in said means.

Another object of the present invention is to provide such current supply means, without it being necessary to connect an external trimming element having a low resistance value thereto, in the event that the current to be supplied must be high.

Another object of the present invention is to provide such current supply means capable of supplying a current having improved precision, in particular in the event of variations in the electric parameters of the external element connected to said means.

Another object of the present invention is to provide such means answering the conventional criteria in the semi-conductor industry as to complexity, space requirement and cost.

One advantage of the current supply means according to the present invention is that it is possible to trim the first current value by the resistance value of the external resistor, without needing to connect additional trimming elements onto the conduction line of the first current. This allows the dimensions of the different components of these means to be determined while optimising the dimensions of the first transistor.

Another advantage of the arrangement of the current supply means according to the present invention is that it enables an external resistor having a usual resistance value to be connected, while guaranteeing a precision of its resistance value of the order of +1%, and a low purchase price.

One advantage of the first and second transistors is that they are connected to operate in saturation state, which has the effect of maintaining the current flowing in the first transistor at its nominal value, in particular in the event that the voltage across the drain terminal of said transistor and its source terminal is modified.

These objects, features and advantages, inter alia of the present invention will appear more clearly upon reading the detailed description of two preferred embodiments of the present invention, given solely by way of example, with reference to the annexed drawings, in which:

BRIEF DESCRIPTION OF THE DRAWINGS

FIG. 3 shows an electric diagram of a circuit including a first embodiment of the current supply means according to the present invention;

FIG. 4 shows an electric diagram of the reference voltage supply means of the circuit of FIG. 3;

FIG. 5 shows an electric diagram of a circuit including a second embodiment of the current supply means according to the present invention; and FIG. 6 shows a curve illustrating the change of the current supplied by the current supply means of the circuit of FIG. 5, following charging of said means as a function of time.

DESCRIPTION OF THE PREFERRED EMBODIMENTS

Figure 1:
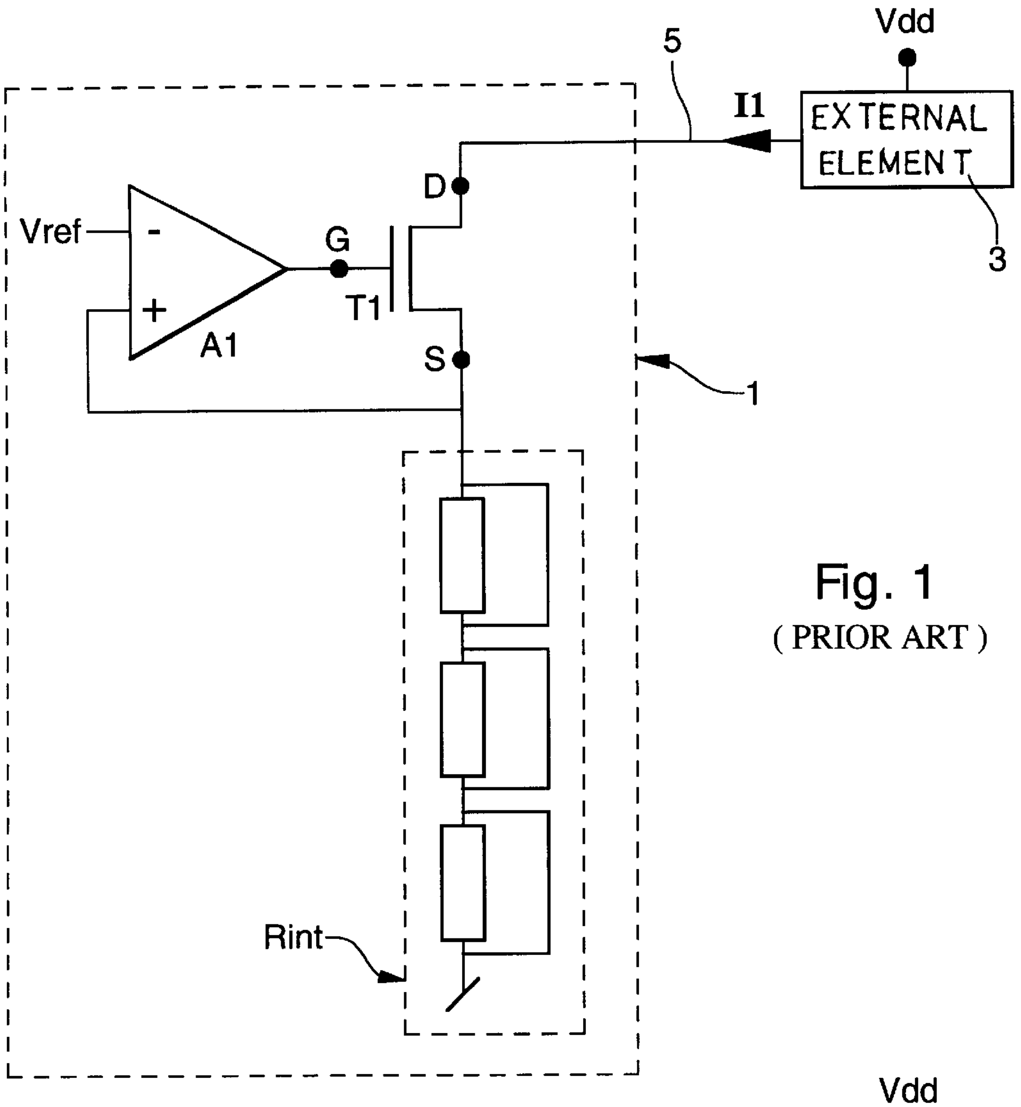
Fig. 1 ( PRIOR ART )
FIG. 1 already cited shows an electric diagram of a first circuit including current supply means according to the prior art.

FIG. 3 shows an electric diagram of a circuit including a first embodiment of current supply means 30 according to the present invention.

Means, 30 are intended to be connected, via a connecting line 5, to an element 3 external to such means. Means 30 are arranged to supply a first current I3 at a desired predetermined value or nominal value to element 3.

For this purpose, means 30 include an operational amplifier A2 and at least a first transistor T3 arranged so that the value of current I3 which flows through it is substantially equal to its nominal value.

It will be noted that the various components of the circuit shown in FIG. 3 are preferably made by a CMOS type manufacturing process widely used in the semi-conductor industry. It goes without saying that these components also include a terminal for connection to a voltage source (not shown) arranged for supplying a supply voltage Vdd to such components. In the embodiment shown in FIG. 3, the voltage source supplies a regulated supply voltage, i.e. a voltage Vdd which is substantially constant.

Transistor T3 made by a process of the aforementioned type, typically includes a drain terminal D, a source terminal S and a gate terminal G. It will be noted that terminal G acts as control terminal for transistor T3, and is intended to receive a control signal VG. Terminal D of transistor T3 is connected to external element 3 by line 5, and terminal S of transistor T3 is connected to earth.

Operational amplifier A2 typically includes an inverting input terminal, a non-inverting input terminal and an output terminal connected to terminal G of transistor T3 to supply control signal $V_G$ thereto. The inverting input terminal of operational amplifier A2 is connected to voltage supply means (not shown) arranged for supplying a reference voltage Vref.

FIG. 4 shows an example of an electric diagram of reference voltage supply means 40 which are intended to be connected to the circuit of FIG. 3. Means 40 include first and second resistors designated R1 and R2 respectively. One of the two terminals of resistor R1 receives supply voltage Vdd from the supply source which also supplies the circuit of FIG. 3, its other terminal is connected to one of the two terminals of resistor R2, and the other terminal of this resistor is earthed. The connection point of resistors R1 and R2 supplies reference voltage Vref which is proportional to supply voltage Vdd. The resistance values of resistors R1 and R2 must be selected so as to supply a reference voltage which is commonly situated in proximity to the middle of the dynamic operating range of operational amplifier A2. In the case of a typical example, for a voltage Vdd equal to 2 volts, reference voltage Vref is of the order of 1 volt.

It goes without saying that the various numerical values provided during the present description are provided purely by way of illustration.

Those skilled in the art will note that operational amplifier A2 is selected as a function of the value of voltage VG to be supplied to transistor T3, and the impedance present at terminal G.

As FIG. 3 shows, means 30 further include a second transistor T4 arranged so that a second current I4 flows through it.

Transistor T4 is made by a CMOS type process, and typically includes a drain terminal D, a source terminal S and a gate terminal G. It will be noted that terminal G acts as control terminal for transistor T4.

Terminal G of transistor T4 is connected to that of transistor T3, so that control signal VG allows both transistor T3 and transistor T4 to be controlled.

Terminal D of transistor T4 is connected to the non-inverting input terminal of operational amplifier A2, and terminal S of transistor T4 is connected to earth.

Moreover, transistor T3 and transistor T4 are advantageously connected so as to operate in saturation state. Transistor T3 is arranged so that the value of current I3 which flows through transistor T3 when the latter is operating in saturation state, is substantially equal to said nominal value of current I3.

Indeed, assuming that the voltage across terminal D of transistor T3 and terminal S thereof, is slightly modified for whatever reason, for example following a variation in the supply voltage which is supplied to external element 3. As a result, the current flowing through transistor T3 (i.e. current I3) remains unchanged, which thus reinforces the current precision, in response to such a modification to the voltage across terminals D and S of said transistor.

Those skilled in the art will note that transistor T4 advantageously has a monitoring function for control voltage VG of transistor T3, and that it is arranged in a feedback control loop allowing control voltage VG to be kept substantially constant, which allows current I3 flowing through transistor T3 to be kept at a substantially constant value.

Transistor T3 is preferably made to have a structure having and identical symmetry to that of transistor T3. Consequently, transistors T3 and T4 have common operating features, such as the threshold voltage. One usually speaks of <<matching >> the two transistors T3 and T4.

During practical realisation of the various components of means 30, such components are dimensioned as a function of the nominal value of the current I3 to be supplied.

For this purpose, an external resistor Re1 is connected to means 30 so that the value of current I3 is equal to its nominal value, as will be described hereinafter. As FIG. 3 shows, external resistor Re1 is connected across terminal D of transistor T4 and a terminal connected for receiving supply voltage Vdd from said voltage source.

Those skilled in the art will note that external resistor Re1 advantageously allows the value of current I3 to be adjusted. Considering the preferred case where transistors T3 and T4 are matched, resistor Re1 allows the output voltage of operational amplifier A2, i.e. control voltage VG of transistors T3 and T4, to be fixed. Consequently, the voltage across terminal D of transistor T3 and its terminal S is thus fixed by the value of external resistor Re1. In other words, the value of current I3 flowing through transistor T3 is trimmed by the resistance value of resistor Re1, so as to become substantially equal to its nominal value.

It is clear that the precision of current I3 is directly Linked to that of resistor Re1. The latter may advantageously have a usual resistance value, contrary to the prior art, as has already been described in relation to FIG. 2. Taking the previously cited example, after calculation, one finds that the resistance value of resistor Re1 must be of the order of 1 kΩ, such a resistor being commonly found commercially, with a precision of the order of +1%. Current I3 can thus be provided with a precision of the order of +3%.

Figure 2:
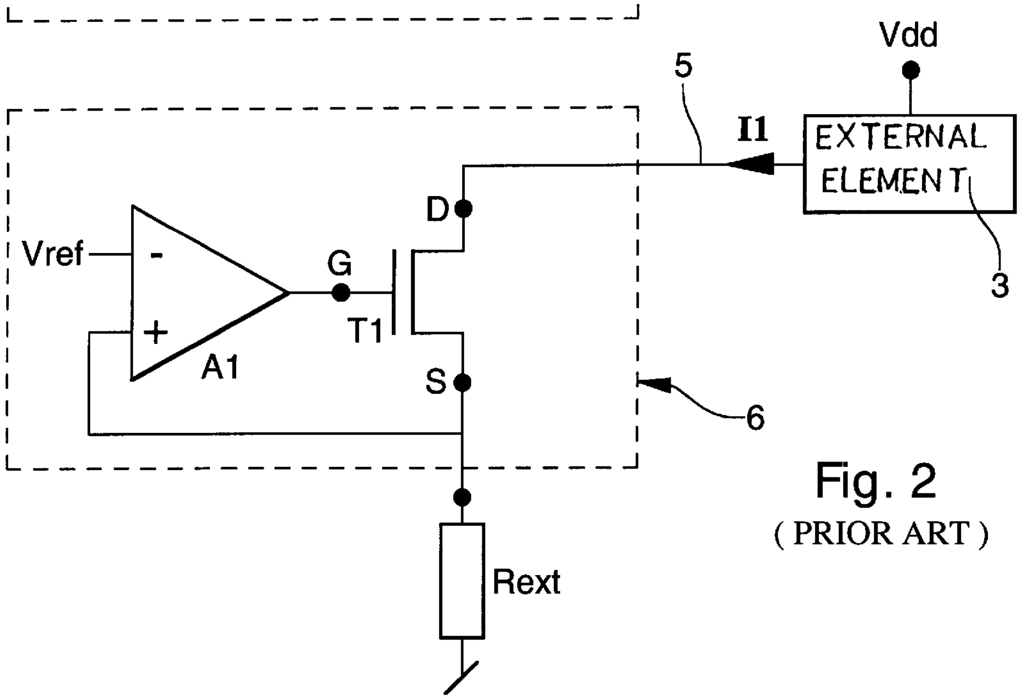
Fig. 2 ( PRIOR ART )
FIG. 2 already cited shows an electric diagram of a second circuit including current supply means according to the prior art.

Those skilled in the art will also note that that fact of having arranged the external trimming resistor outside the line of flow (i.e. line 5) of current I3 allows transistor T3 to use the whole of the voltage across terminal D thereof and earth, since terminal S of this transistor (T1) is directly connected to earth, unlike the circuit shown in FIG. 2.

Consequently, the dimensions of the active surface of this transistor can advantageously be decreased, since a higher voltage is available across terminals D and S of this transistor. It will be recalled that the dimensions of the active surface are typically the length and the width of the conduction channel, in the case of a conventional MOS transistor.

By way of alternative, FIG. 5 shows an electric diagram of a circuit including a second embodiment of current supply means 50 according to the present invention, in the case where supply voltage Vdd is supplied by a supply source such as an accumulator 52. In this case, supply voltage Vdd depends upon the charge present in the accumulator, i.e. this voltage is not constant over time.

It will be noted that the circuit shown in FIG. 5 is close to that shown in FIG. 3. Thus, the components shown in FIG. 5 and designated by the same references as those shown in FIG. 3, are similar to those shown in FIG. 3.

However, those skilled in the art will note that the non-inverting input terminal of operational amplifier A2 of the circuit shown in FIG. 5 must be independent from voltage Vdd. For this purpose, terminal D of transistor T4 of means 50 is connected to one of the terminals of an external resistor Re2, via a current mirror 51 which is known, the other terminal of resistor Re2 being connected to earth. Consequently, the current flowing through resistor Re2 has a value of I4/m, the reference m designating the current mirror ratio. Typically the ratio is of the order of 2.

Taking the case of the example previously cited, in order to obtain a value of current I3 equal to 50 mA, the resistance value of external resistor Re2 is of the order of 10 kΩ, this value having been obtained by calculations. Those skilled in the art will note that resistors having such a resistance value and guaranteeing a precision of the order of +1%, and a low cost, unlike external resistor Re1 described in relation to FIG. 2, are commonly found commercially.

It goes without saying that the different numerical values cited hereinbefore are given solely by way of illustration. In particular, the resistance value of resistance Re2 depends in particular upon ratio m.

By way of improvement, the current supply means according to the present invention can include a plurality of identical first transistors, each transistor being provided with a control terminal, and the control terminals of these transistors all being connected to the operational amplifier output terminal.

Such an arrangement of the current supply means according to the present invention is particularly advantageous, since they can provide with great precision a high current to an external element. Indeed, all the transistors of these means can be made in an identical manner during the same steps of a known CMOS type of manufacturing process. Thus, with reference to FIG. 3 (FIG. 5 respectively) means 30 (means 50 respectively) can include a transistor T4 and n transistors T3 identical to transistor T4. Thus, the dimensions of the active surface of transistors T3 are identical to those of transistor T4, and current I3 supplied by means 30 (means 50 respectively) is thus equal to n times the current I4, which allows the supply of a high current I3 to be achieved.

The implementation of the current supply means according to the present invention will now be described, in the event that one wishes to supply a current I3 having a predetermined nominal value to an external element 3. This implementation will be illustrated using means 30 of FIG. 3. It goes without saying that the different numerical values are given hereinafter solely by way of illustration.

Let us consider that the nominal value of current I3 is 50 mA and that one wishes to make 50 transistors T3 each capable of supplying a value of 1 mA. Moreover, it is known that external element 3 is capable of supplying a determined voltage across terminals D and S of transistor T3.

The dimensions of the active surface of transistor T3 are then determined, so that the value of current I3, when transistor T3 operates in saturation state, is equal to 1 mA. Consequently, the value of control signal VG (i.e. of the gate voltage of transistors T3 and T4) is determined by the drain-voltage drain-source current characteristic as a function of the gate voltage.

Thus the different voltages present at terminals S, D and G of transistors T3 and T4 are determined, assuming that the 50 transistors T3 and transistor T4 are identical.

The value of resistor Re1 is selected so that the voltage present across its terminals is equal to the voltage present across terminals D and S of transistor T3, when a value of current I4 equal to 1 mA flows through resistor Re1.

The operation of the circuit shown in FIG. 3 is then stable, when the voltage across the terminals of resistor Re1 is equal to reference voltage Vref, i.e. when the value of current I3 is equal to 50 times that of current I4. In other words, the operation of this circuit is stable when current I4 flowing through transistor T4 has a value of 1 mA, and current I3 supplied by means 30 is equal to 50 mA, with a precision of the order of ±3%, for a resistor Re1 having a value of 1 kΩ×1%.

By way of example, FIG. 6 shows a curve 60 illustrating the change over time of the current supplied by the means according to the present invention, following powering of said means.

The reference t0 designates the instant at which the circuit shown in FIG. 3 is powered, and the reference t1 designates the instant from which the operation of this circuit is stable. Thus, assuming that supply voltage Vdd has a value of 2 volts, the Applicant of the present invention has measured that the stabilisation time is then of the order of 2 $\mu$s.

It goes without saying for those skilled in the art that the detailed description hereinbefore can undergo various modifications without departing from the scope of the present invention.

What is claimed is:

1. Current supply means for supplying a first current to an external element intended to be connected to said means, said current having to be supplied with high precision at a desired predetermined value or nominal value, said current supply means being connected to a power supply, and including:

at least one first transistor provided with a control terminal intended to receive a control signal, said transistor being arranged so that said first current flows through it; and an operational amplifier having a first input terminal, to which a reference voltage is supplied by reference voltage supply means, and an output terminal to which is supplied the first transistor control signal, said current supply means being connected to an external resistor arranged for trimming the value of the first current to its nominal value independently of a change in said power supply, wherein said means further include a second transistor, connected in a feedback control loop of the operational amplifier, and arranged so that a second current proportional to said first current flows through it, wherein a current mirror circuit is connected to said second transistor so that the second current flows through it, and wherein said mirror current circuit supplies a third current, proportional to said second current, to said external resistor connected to a second input terminal of said amplifier.

2. Current supply means according to claim 1, wherein said first and second transistors are field effect transistors connected so as to operate in saturation state, and wherein said first transistor is arranged so that the value of the first current which flows through said first transistor operating in saturation state is substantially equal to said nominal value of said first current.

3. Current supply means according to claim 1, wherein said second transistor is provided with a control terminal connected to that of said first transistor, so that the control signal allows both said first transistor and said second transistor to be controlled.

4. Current supply means according to claim 1, further including a plurality of identical first transistors, each transistor being provided with a control terminal, and wherein the control terminals of said transistors are all connected to the output terminal of said operational amplifier.

5. Current supply means according to claim 1, wherein said second transistor is made so that its active surface is substantially symmetrical to that of said first transistor.

6. Current supply means according to claim 2, wherein said mirror current circuit is connected between a drain terminal of said second transistor and an inverting input terminal of said operational amplifier, the non-inverting input terminal being connected to said reference voltage.

7. The current supply means according to claim 6, wherein said first and second transistors are N-channel transistors having gate terminals, controlled by the control signal, and source terminals connected to earth, wherein said mirror current circuit comprises P-channel transistors, and wherein the external resistor is connected between the inverting terminal of said operational amplifier and earth, the value of the reference voltage being independent of a change in the power supply.

8. The power supply according to claim 1, wherein said current supply means is an accumulator.

* * * * *